United States Patent
Gueguen

(10) Patent No.: US 6,892,335 B2
(45) Date of Patent: May 10, 2005

(54) METHOD FOR THE OPTIMIZATION, UNDER RESOURCE CONSTRAINT, OF THE SIZE OF BLOCKS OF CODED DATA

(75) Inventor: Arnaud Gueguen, Rennes (FR)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 400 days.

(21) Appl. No.: 10/093,495

(22) Filed: Mar. 11, 2002

(65) Prior Publication Data

US 2002/0194555 A1 Dec. 19, 2002

(30) Foreign Application Priority Data

Mar. 19, 2001 (FR) .............................. 01 03789

(51) Int. Cl.$^7$ ................................ G06F 11/00
(52) U.S. Cl. ................ 714/701; 714/758; 714/759; 714/786; 370/277
(58) Field of Search ................ 714/701, 752, 714/746, 758, 759, 760, 786, 799, 704, 795; 380/200; 370/277, 470

(56) References Cited

U.S. PATENT DOCUMENTS 5,307,351 A * 4/1994 Webster .................... 370/470
5,721,745 A    2/1998 Hladik et al.
6,526,531 B1 * 2/2003 Wang ......................... 714/704
6,598,204 B1 * 7/2003 Giese et al. ................ 714/795

FOREIGN PATENT DOCUMENTS

EP         0 917 294        5/1999
WO       WO 99/11009       3/1999

OTHER PUBLICATIONS

U.S. Appl. No. 10/093,495, filed Mar. 11, 2002, pending.
U.S. Appl. No. 10/091,279, filed Mar. 6, 2002, pending.

* cited by examiner

*Primary Examiner*—Albert Decady
*Assistant Examiner*—Dipakkumar Gandhi
(74) *Attorney, Agent, or Firm*—Oblon, Spivak, McClelland, Maier & Neustadt, P.C.

(57) ABSTRACT

A method of optimizing the size of blocks of coded data, intended to be subjected to iterative decoding, the method comprising a first step of evaluating a resource (T) available for the decoding of a block of normal size (N) and a second step of seeking, amongst a plurality of block sizes (N/k) which are submultiples of the normal size by an integer factor (k) greater than or equal to 1 and requiring on average a number of iterations ($\bar{n}_{iterations}^{(k)}$) compatible with the said available resource, the one which makes it possible to obtain the lowest error rate at the output of the iterative decoding.

19 Claims, 9 Drawing Sheets

METHOD FOR THE OPTIMIZATION, UNDER RESOURCE CONSTRAINT, OF THE SIZE OF BLOCKS OF CODED DATA

BACKGROUND OF THE INVENTION

1. Field of Invention
2. Discussion of the Related Art

The present invention concerns a method of optimising the size of a block of coded data intended to be subjected to an iterative decoding, such as the one implemented in a turbodecoder or a turboequaliser. It applies in particular to the so-called third generation telecommunications systems.

The concept of turbocode was introduced by C. Berrou, A. Glavieux and P. Thitimajshima in their article "Near Shannon Limit Error-Correcting Coding and Decoding: Turbocodes", ICC-1993, Conference Proceedings, pp. 1064–1070, and has, as is known, been subject to many developments.

It will be recalled that turbocoding results from the concatenation of elementary codes separated by interleaving steps. The elementary codes can be of different types: recursive systematic codes (denoted RSC) for convolutional turbocodes or block codes (RS, BCH) for block turbocodes. The latter were described by R. Pyndiah, P. Combelles and P. Adde in an article entitled "A very low complexity block turbo decoder for product codes", published in Proc. of IEEE Globecom, pp. 101–105, 1996. Different types of concatenation have been envisaged such as parallel concatenation, in which the same information is coded separately by each coder after having been interleaved and serial concatenation in which the output of each coder is interleaved before being coded by the following coder. For a detailed description, reference can be made, for parallel concatenation, to the aforementioned article by Berrou et al. and, for serial concatenation, to the article by S. Benedetto, G. Montorsi, D. Divsalar and F. Pollara, "Serial concatenation of interleaved codes: Performance analysis, design and iterative decoding", JPL TDA Progr. Rep., Vol. 42–126, August 1996.

The decoding of a turbocode is conventionally effected by means of an iterative process also referred to as turbodecoding, consisting of a series of elementary decoding operations, each elementary decoding operation receiving weighted input values and supplying weighted output values, relating respectively to the input and, for a serial turbocode, to the output of the corresponding elementary coding operation. The weighted input and output values represent the probabilities of the binary or M-ary symbols at the input and (for serial turbocodes) at the output of the corresponding elementary coder. Deinterleaving and interleaving operations take place as a function of the interleaving operations performed at coding and enable each elementary decoding operation to take account of the data in the same order as that at the input of the corresponding coding operation.

FIG. 1a illustrates schematically an example of a turbocoder. The turbocoder depicted is a parallel turbocoder of dimension 2. The information x, in the form of a block of data, is coded by a first elementary coder 110 in order to supply a first output $y_1$ and by a second elementary coder 120, after having been interleaved by the interleaver 115, in order to supply a second output $y_2$. The systematic information is multiplexed at 130 with the coded information $y_1$ and $y_2$ before being interleaved by a channel interleaver 140.

On reception, the information is decoded by means of the turbodecoder depicted in FIG. 1b. After deinterleaving in the channel deinterleaver 145, the information x, $y_1$ and $y_2$ is demultiplexed by the demultiplexer 150. The elementary decoders 160 and 170, for example of the Log MAP type, correspond respectively to the elementary coders 110 and 120. The decoder 160, of the weighted input and output type, receives a priori information on x and the coded information $y_1$ in order to derive therefrom a posteriori information on x. The difference between the a posteriori information and the a priori information is called extrinsic information. The a priori information on x and the extrinsic information $e_1$ supplied by the first decoder are interleaved and then added in order to supply to the decoder 170 new a priori information on x (or more precisely on x', the interleaved version of x). The decoder 170 estimates, from this a priori information and the coded information $y_2$, a posteriori information on x'. The intrinsic information $e'_2$ is derived therefrom by difference in 171 before being deinterleaved in the deinterleaver 180 and is then added at 151 to the systematic information in order to supply new a priori information on x to the decoder 160. The decoding steps are then repeated, for a predetermined number of iterations $n_{iterations}$. The flexible values at the output of the decoder 170 are submitted to a decision device 190 in order to supply hard values. An error correction check 195 operating on the output of 190 determines whether the decoded block is error-free and, in the affirmative, interrupts the iterations without having to await the predetermined number $n_{iterations}$. Alternatively, in order to decide on the stoppage of the iterations, the turbodecoder can use, instead of a CRC, another stoppage criterion on the weighted values, such as the one disclosed, for example, in the article by J. Hagenauer et al. entitled "Iterative decoding of binary block and convolutional codes", IEEE Transactions on Information Theory, vol. 42, pp. 429–445, published in March 1996, or in the article by M. Moher entitled "Decoding via cross entropy minimization", in Proc. IEEE Globecom Conf., Houston, Tex., pp. 809–813, published in December 1993.

The principle of iterative decoding was transposed to equalisation by C. Douillard et al. in an article entitled "Iterative Correction of Intersymbol Interference: Turbo-equalization", published in European Trans. Telecomm., Vol. 6, N° 5, September/October, pages 507–511. This iterative equalisation method, also referred to as turboequalisation, starts from the principle that a channel affected by intersymbol interference (ISI) can be considered to be equivalent to a convolutional coder and consequently the concatenation of a channel coder, an interleaver and a transmission channel can itself be considered to be the equivalent of a turbocoder.

FIG. 2b illustrates schematically the structure of a turboequaliser. It will be assumed that the data were, on the same side as the transmitter depicted in FIG. 2a, the subject of channel coding in a coder 201 before being interleaved in an interleaver 202 and subjected to M-ary to symbol mapping in the modulator 203. The data are transmitted in the form of a block of symbols interleaved by the channel interleaver 204. The turboequaliser comprises first of all a channel deinterleaver 210 followed by a weighted output equaliser of the Log-MAP type supplying flexible values of coded data. These data are deinterleaved in the deinterleaver 230 before being decoded by a decoder 240 of the Log-MAP type with weighted output. The flexible values issuing from the decoder 240 are submitted to a decision device 250 supplying the corresponding hard values. The weighted values at the input of the decoder 240 are subtracted from the output values in order to supply extrinsic information e. After interleaving, the extrinsic information is on the one hand subtracted at the output of the equaliser 220 and on the other hand remodulated before being transmitted to the equaliser. From the symbols received and the remodulated extrinsic information, the equaliser 220 proceeds with a new a priori estimation. The turboequaliser thus carries out a predetermined number of iterations on a block of symbols. An error correction check 260 at the output of 250 diagnoses the presence or absence of errors, the iteration process is interrupted without the iterations without having to wait for the predetermined number $n_{iterations}$. The stoppage criterion can alternatively relate to the weighted values, as seen above.

It should be noted in relation to the design that both for turbocoding and for turboequalisation the iterations can be carried out one after the other within the same processor or in dedicated circuits arranged in a pipeline, each being responsible for an iteration of given rank.

In the cases of turbocoding and turboequalisation, the performance in terms of bit error rate (BER) or packet error rate (PER) is all the better, the greater the length of the size N of the internal interleaver (IL). This is because the increase in the size of the internal interleaver, that is to say the size of the block on which the interleaving is carried out, improves both the Hamming weight distribution of the turbocode and the efficacy of the iterative decoding. The interleaving gain varies according to the type of turbocode. Hereinafter the term "performance" will be used indifferently for the BER or the PER on the decoded data.

FIG. 3 shows, by way of example, the interleaving gain for the turbocoder of FIG. 1a, whose elementary coders are RSC (Recursive Systematic Convolutional) coders of polynomials $(13,15)_{oct}$, when the size N of the block changes from 200 to 1000.

When the signal to noise ratio (SNR or C/N standing for Carrier/Noise) is low, it is known from the state of the art that high values of N can be used for improving the performance of the system. However, the increase in N is to the detriment of the latency of the receiver, that is to say the time at the end of which a block of data or symbols received is actually available in decoded form. This is because the latency time at the receiver can be written:

$$T_{latency} = T_{rec} + \frac{N}{D_d} \cdot n_{iterations} \quad (1)$$

where $D_d$ is the decoding rate per iteration and $T_{rec}$ is the time at the end of which the block of size N is available in deinterleaved form, at the receiver. If a channel interleaving of size M, with M≧N, is applied at the transmitter, this will give $T_{rec}=M/D_u$ where $D_u$ is the useful information rate. If no channel interleaving is used, the reception time will simply be $T_{rec}=N/D_u$.

For a given maximum latency time or set latency time and a predetermined number of iterations, formula (1) makes it possible to obtain the block size giving the maximum performance.

Conversely, a reduction in the latency time can be obtained by reducing the size of the blocks, at the cost however of a correlative reduction in the performance of the system. In order to regain acceptable performance, it is known that the transmission power can be increased, which naturally burdens the resources of the system.

SUMMARY OF THE INVENTION

The problem at the basis of the invention is to determine, for a given maximum latency time and in general terms for a given resources, a block size N affording better performance than in the state of the art.

The solution afforded by the invention is defined by a method of optimising the size of coded data blocks, intended to be subjected to an iterative decoding, comprising a first step evaluating a resource available for the decoding of a block of normal size and a second step seeking, amongst a plurality of block sizes which are submultiples of the normal size by an integer factor greater than or equal to 1 and requiring on average a number of iterations compatible with the said available resource, the one which makes it possible to obtain the lowest error rate at the output of the iterative decoding.

The available resource is for example an available time or energy for receiving all the data of a block and for effecting the iterative decoding on the said block. If the data have been interleaved by a channel interleaver, the said available resource can be a time or energy available for obtaining the data of a block in deinterleaved form and for effecting the iterative decoding on a block of deinterleaved data.

Advantageously, the first step also determines, for the normal block size, the maximum number of iterations compatible with the said available resource. There are then estimated, according to a required maximum error rate, the minimum number of iterations which must be effected by the iterative decoding, for the current block size and the signal to noise ratio.

The second step may not be effected if the said maximum number of iterations exceeds the said minimum number of iterations.

According to one embodiment, the second step selects, from amongst the sizes of blocks of which are submultiples of the normal size and amongst different maximum numbers of iterations, the block size and the largest maximum number of iterations associated with this size, giving a mean number of iterations compatible with the said available resource. The optimum size which makes it possible to obtain the lowest error rate at the output of the iterative decoding is sought amongst the selected submultiple sizes and for the associated maximum numbers of iterations.

For a size which is a submultiple by a given factor k and a given maximum number of iterations, the mean number of iterations can be determined according to the signal to noise ratio as the mean value of the number of iterations which would be effected by the iterative decoding for each block in a succession of blocks of submultiple size, the iterations being stopped on a block of the said submultiple size if a predetermined reliability criterion is satisfied or if the number of iterations for this block reaches the said given maximum number of iterations.

Advantageously, the mean numbers of iterations for different submultiple sizes, different maximum numbers of iterations and different signal to noise ratios are stored in a table. The table can be updated as the iterative decoding continues. Where applicable, the mean numbers of iterations will be obtained by interpolation from values available in the table.

According to a first variant, after the data in a block of initial size has been coded as a sequence of sub-blocks of optimum size, the sub-blocks are decoded, one by one, by means of a succession of iterations of the iterative decoding, the iterations being stopped for a sub-block if a predetermined reliability criterion is satisfied or if the number of iterations reaches the maximum number of iterations associated with the said optimum size.

According to a second variant, after the data in a block of initial size have been coded as a sequence of sub-blocks of optimum size, the sub-blocks are decoded by effecting successively on each sub-block an iteration of the iterative decoding, an iteration not being performed on a sub-block if a predetermined stop criterion is satisfied or if the number of iterations reaches the maximum number of iterations associated with the said optimum size. Alternatively, an iteration will not be performed for a sub-block if a predetermined stop criterion is satisfied or if the said available resource is exhausted.

The invention is also defined by a device for the iteration decoding of blocks of data coded by a turbocoder having means for implementing the optimisation method disclosed above, the said means supplying an optimum block size and the device also comprising means for transmitting optimum block size information to the turbocoder.

The invention also concerns a coding/decoding system comprising a turbocoder adapted to code blocks of data and an iterative decoding device as defined above, adapted to decode the blocks of data coded by the turbocoder, the latter comprising means for receiving the said optimum block size information and for modifying the size of at least one internal interleaver according to the said received information.

The invention also concerns a device for coding blocks of data, the device having means for implementing the optimisation method as defined above, the said means supplying an optimum block size, the device also comprising means for adaptively modifying the size of the blocks of coded data according to the said optimum block size.

Finally, the invention concerns a device for the turboequalisation of blocks of data coded by a coder and modulated, the device having means for implementing the optimisation method defined above, the said means supplying an optimum block size, the said device also comprising means for transmitting optimum block size information to the coder.

The characteristics of the invention mentioned above, as well as others, will emerge more clearly from a reading of the following description of an example embodiment, the said description being given in relation to the accompanying drawings, amongst which:

LIST OF FIGURES

FIG. 1b illustrates schematically an example of a turbodecoder, with a known structure, adapted to decode data coded by the turbocoder of FIG. 1a;

DETAILED DESCRIPTION OF THE INVENTION

Figure 4A:
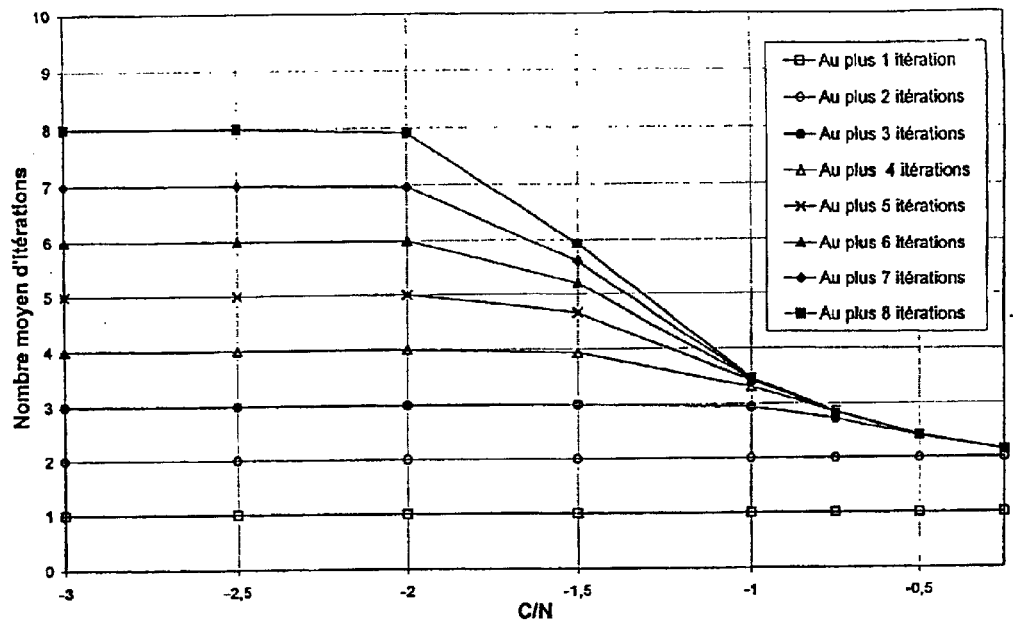
FIG. 4a shows the mean number of iterations of the turbodecoder of FIG. 1b for a given maximum number of iterations and when a perfect stop criterion is used and in the case where the block size has a first value.
Figure 4B:
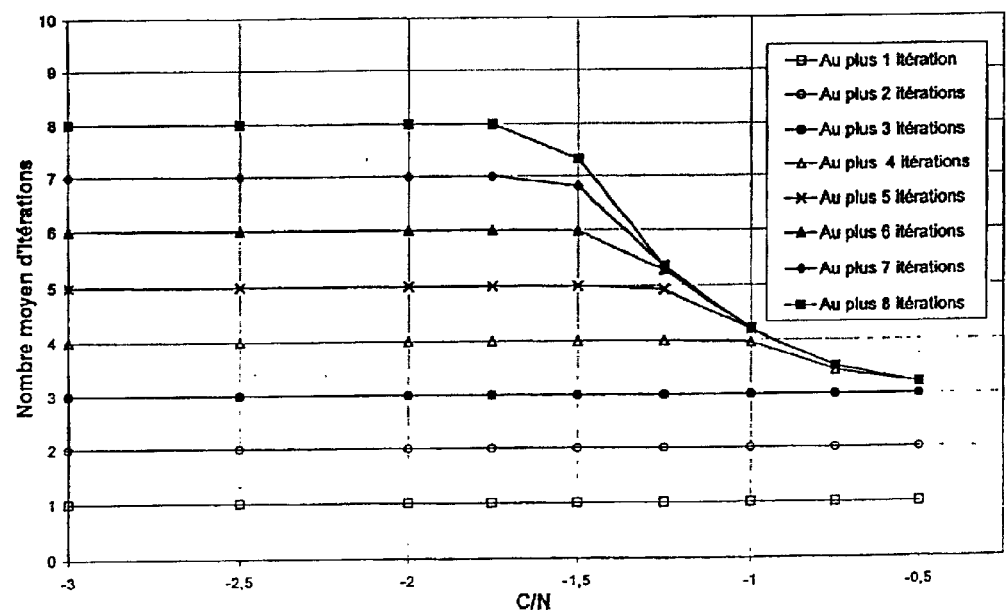
FIG. 4b shows the mean number of iterations of the turbodecoder of FIG. 1b for a given maximum number of iterations and when a perfect stop criterion is used and in the case where the block size has a second value.

The general idea at the basis of the invention is to take advantage of the fact that, in an iterative decoder, for a predetermined maximum number of iterations $n_{iterations}$ which will also be referred to as the set number, the block can be entirely decoded before the last iteration provided for. For example, if the stop criterion for the iterations is a perfect ideal criterion (zero BET, that is to say with a complete absence of errors in the block), the mean number of iterations, $\bar{n}_{iterations}$, is often less than the set number, as can be discerned in FIG. 4a. This figure shows the change in $\bar{n}_{iterations}$ as a function of the signal to noise ratio for different values of $n_{iterations}$ and for a block size of N=1000. FIG. 4b shows this change for a block size N=10,000. In the two examples, it can be seen that, for a given maximum number of iterations, $n_{iterations}$, the mean number of iterations does not reach the maximum, and this all the more so when the signal to noise ratio is high. Naturally, in practice, there is no perfect criterion: the absence of errors is tested, for example, by means of a CRC and the iterations are stopped as soon as the CRC no longer detects any errors. The conclusions concerning the change in $\bar{n}_{iterations}$ with respect to $n_{iterations}$ do however remain valid.

Figure 5:
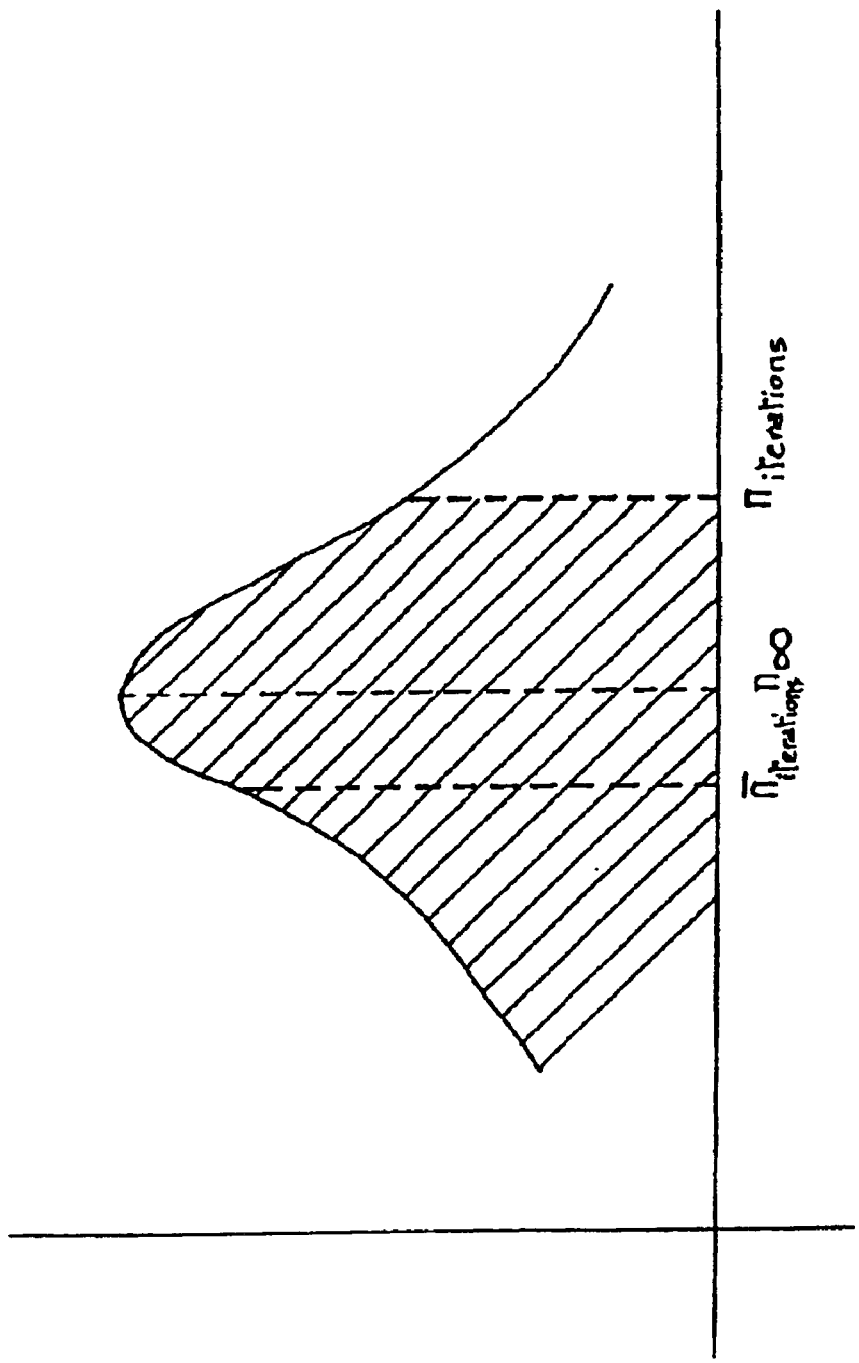
FIG. 5 depicts a histogram of the number of iterations necessary for satisfying a perfect stoppage criterion.

FIG. 5 shows schematically a histogram of the number of iterations necessary for obtaining a zero BET (and therefore PET). As, in practice, it is not possible to effect an infinite number of iterations, there is fixed, as seen above, a set number of iterations $n_{iterations}$ compatible with the latency time and the size of the interleaver according to (1) is derived therefrom. The mean $\bar{n}_\infty$ of the histogram corresponds to an infinite set number. For a given set number $n_{iterations}$, the mean $\bar{n}_{iterations}$ is taken on the hatched area of the curve.

Let it be assumed that there is given a set latency time T and that there has been determined a pair of values ($n_{iterations}$, N) satisfying $T_{latency} \leq T$ where $T_{latency}$ is given by (1). $n_{iterations}$ and $T_{latency}$ will hereinafter be denoted respectively $n_{iterations}^{(1)}$ and $T_{latency}^{(1)}$.

Let it be assumed now that the size N of the block, and therefore the size of the internal interleaver of the turbocoder or of the turboequaliser, is divided by a non-zero integer k. The latency time $T_{latency}^{(k)}$ at the end of which the k blocks of reduced size N/k are decoded is then expressed as:

$$T_{latency}^{(k)} = T_{rec}^{(k)} + \sum_{i=1}^{k} \frac{N/k}{D_d} \cdot n_{iterations}(i) = T_{rec}^{(k)} + \frac{N}{D_d} \cdot \bar{n}_{iterations}^{(k)} \quad (2)$$

where $T_{rec}^{(k)}$ is a reception time at the end of which the k blocks of size N/k are available, where applicable in inter leaved form, at the receiver. In the absence of channel interleaving, this reception time is equal to $$\frac{N}{k \cdot D_u} + \sum_{i=2}^{k} \delta t_{rec}^{(i)} \text{ where } \frac{N}{k \cdot D_u}$$

is the reception time of the $1^{st}$ block of size N/k and $\delta t_{rec}^{(i)}$ is the time which the receiver must wait between the end of the decoding of the $(i-1)^{th}$ block and the end of the reception of the $i^{th}$ block. Consequently this gives:

$$\frac{N}{k \cdot D_u} \leq T_{rec}^{(k)} < \frac{N}{D_u}.$$

On the other hand, when a channel interleaving of size $M_k$ with $M_k \geq N/k$ has been applied at the transmitter, this gives:

$$T_{rec}^{(k)} = M_k / D_u + \sum_{i=2}^{N/M_k} \delta_{rec}^{(i)}$$

where $\delta_{rec}^{(i)}$ is the waiting time between the end of the deinterleaving of the $(i-1)^{th}$ group of $k.M_k/N$ blocks and their decoding on the one hand and the end of reception of the $i^{th}$ group on the other hand. In practice, $M_k=N$ will be taken and therefore $T_{rec}^{(k)}=M_k/D_u$.

$n_{iterations}(i)$ is the number of iterations effected by the decoder on the $i^{th}$ block of size N/k using a predetermined stoppage criterion and for a given set number of iterations $n_{iterations}^{(k)}$;

$\bar{n}_{iterations}^{(k)}$ is the mean number of iterations, taken on the set of k blocks. It should be noted that $\bar{n}_{iterations}^{(k)}$ in general depends on the set number $n_{iterations}^{(k)}$ chosen for the block size N/k and on the signal to noise ratio. Hereinafter the term (N/k, $n_{iterations}^{(k)}$) will be used for a turbocode operating on blocks of size N/k and decoded by means of at most $n_{iterations}^{(k)}$ per block.

It should first of all be noted that, in general, the size $M_k$ of the channel interleaving decreases (in the broad sense) with k, and therefore $T_{rec}^{(k)}$ is a decreasing function of k: $T_{rec}^{(k+1)} \leq T_{rec}^{(k)}$ whether or not a channel interleaving is applied.

It should also be noted that the stoppage criterion can tolerate a predetermined residual error rate. Use can be made, as mentioned above, of a stoppage criterion operating on a weighted output or outputs or extrinsic information and the stoppage of the iterations can be triggered when a predetermined reliability threshold is reached. In all cases, the stoppage criterion relates to the reliability of the blocks of decoded data and for this reason will also be referred to as the reliability criterion. The stoppage criterion used is chosen so as to be identical for all values of k.

The invention is based on the fact that it is generally possible to find an integer k and a set number $n_{iterations}^{(k)}$ such that the constraint $T_{latency}^{(k)} \leq T$ is satisfied while giving better performance than for k=1. The relationship $T_{latency}^{(k)} \leq T$ is generally less constraining than $T_{latency}^{(1)} \leq T$ since it involves the mean number of iterations ($\bar{n}_{iterations}^{(k)}$) rather than the maximum number of iterations ($n_{iterations}^{(1)}$).

Figure 6:
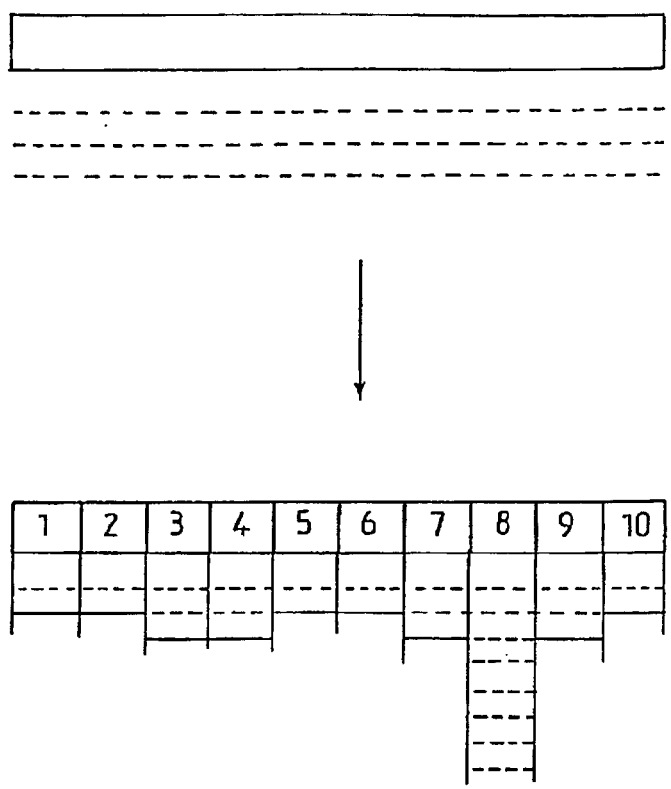
FIG. 6 illustrates the advantage of the averaging of the number of iterations resulting from the present invention.

The comparison between the two situations is illustrated in FIG. 6. An iteration is represented by a horizontal line extending over the length of the block. The line is dotted if errors remain after the iteration and solid in the contrary case. The top part of the figure illustrates the process of iterative decoding on a block of size N and for a set number $n_{iterations}^{(1)}=3$ satisfying the latency constraint $3N/D_d \leq T$ (it is assumed in order to simplify that there is no channel interleaving and that the reception time is zero). The iterative process has not converged at the end of the $3^{rd}$ iteration and the decoded block has residual errors. The bottom part of the figure illustrates the situation when the size of the block is divided by 10. The set number $n_{iterations}^{(10)}$ has been chosen so as to be equal to 8. It can be seen that, for the great majority of the blocks, the iterative process converges well before $n_{iterations}^{(10)}$ and even before $n_{iterations}^{(1)}$ iterations: in this example, only block N° 8 still has errors at the end of the $8^{th}$ iteration. The latency constraint is well complied with since $\bar{n}_{iterations}^{(10)}=3$. Division of the block made it possible, for constant latency and calculation resources, to "concentrate" the iterations on the critical blocks. Thus the performance of the receiver is, before division of the block, that of a turbocode of length N with 3 decoding iterations whilst, after division, it is that of a turbocode of length N/10 after 8 decoding iterations.

Figure 1A:
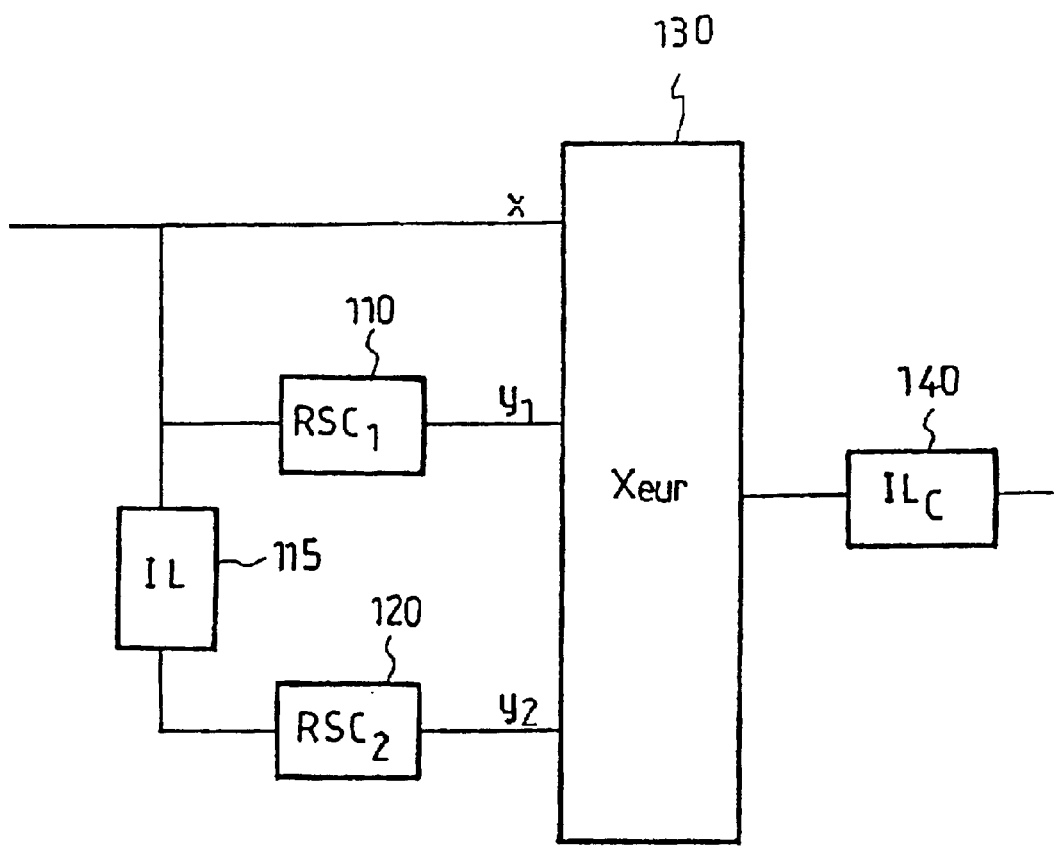
FIG. 1a illustrates schematically an example of a known turbocoder of the state of the art.
Figure 1B:
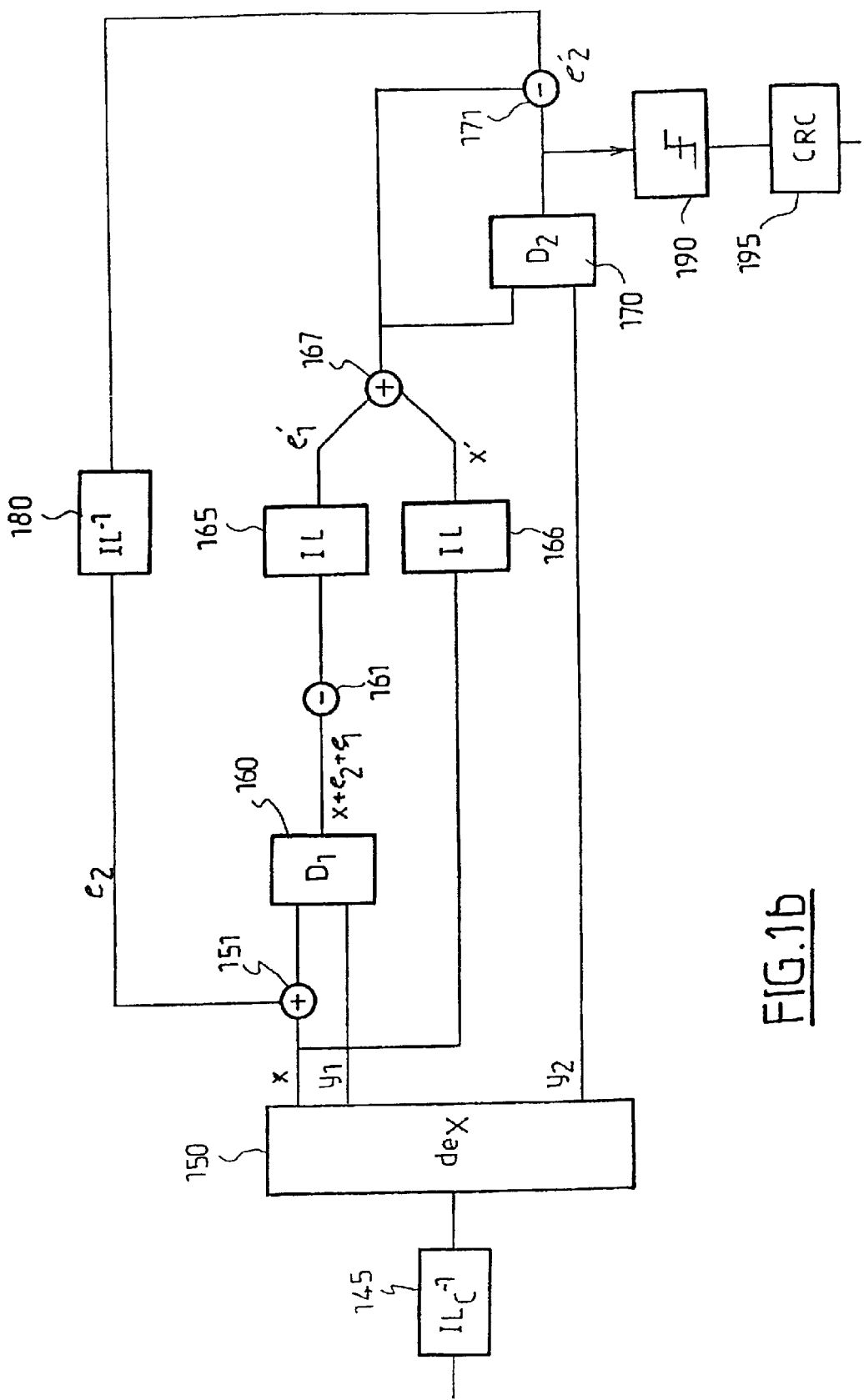
Figure 2A:
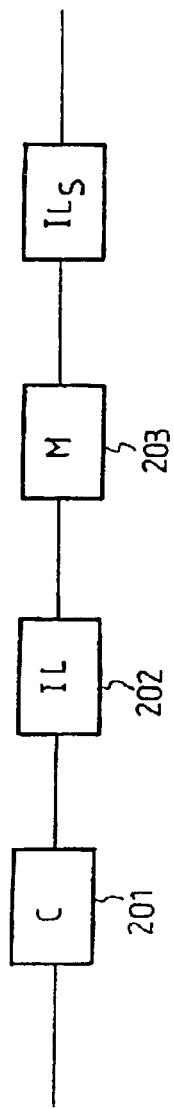
FIG. 2a illustrates schematically an example of a known transmitter of the state of the art.
Figure 2B:
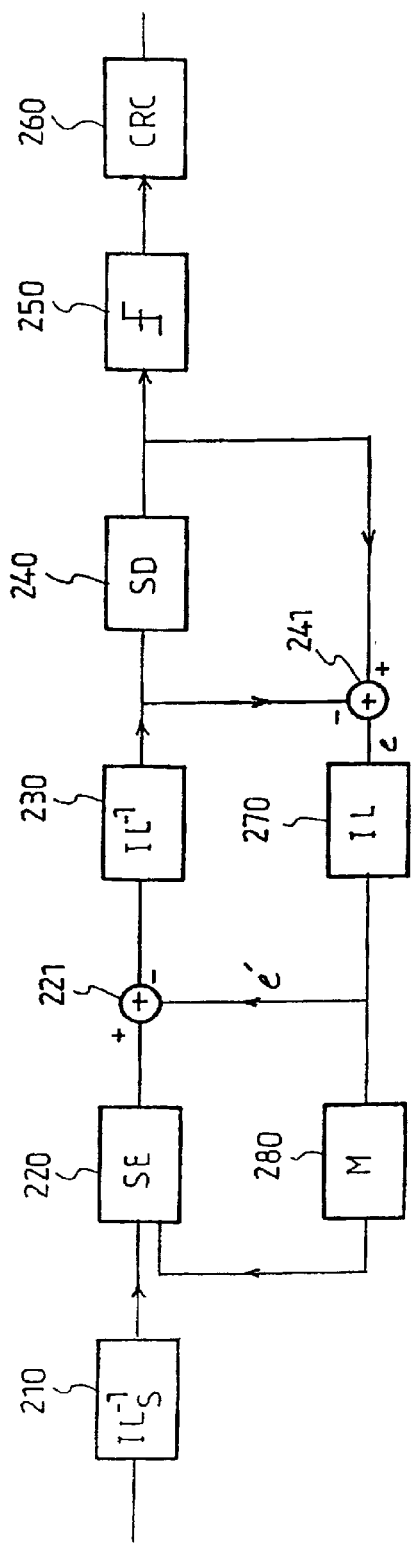
FIG. 2b illustrates schematically an example of a known turboequaliser of the state of the art.
Figure 3:
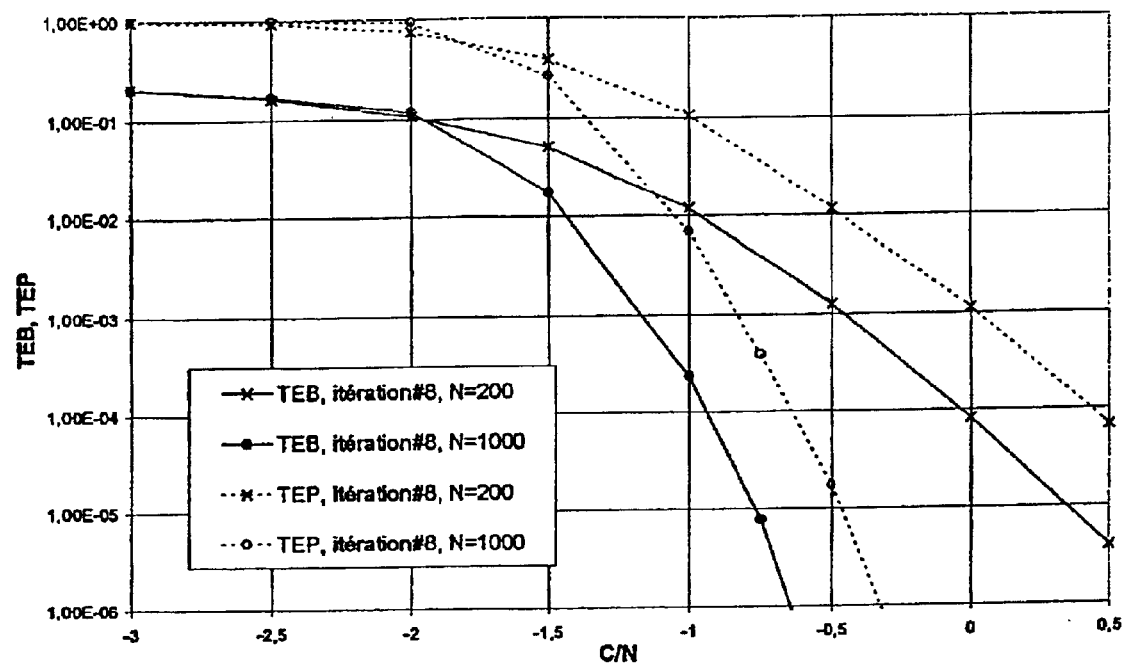
FIG. 3 shows the interleaving gain of the turbocoder of FIG. 1a changing from a first block size to a second block size.
Figure 7:
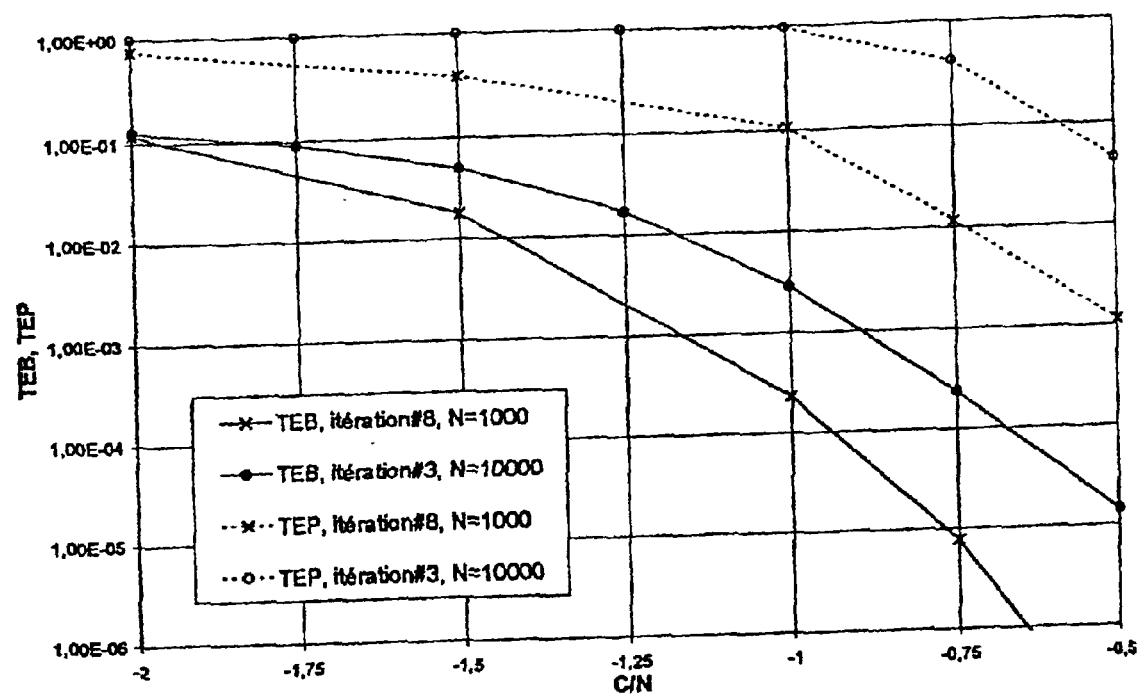
FIG. 7 illustrates the performances of turbocodes with different interleaving lengths and set numbers of iterations.

FIG. 7 illustrates the performance of a turbocode coded by the turbocoder of FIG. 1a consisting of two elementary coders of polynomials $(13,15)_{oct}$, when the length of the block (and therefore of the interleaver 115) changes from N=10,000 to N=1000 and when the set number of iterations changes correlatively from $n_{iterations}^{(1)}=3$ to $n_{iterations}^{(10)}=8$. This comparison is valid only for $\bar{n}_{iterations}^{(10)} \leq 3$, which corresponds to $C/N \leq -0.75$ dB, as can be seen in FIG. 4a. It can be seen in FIG. 4b that, for a signal to noise ratio of $-0.75$ dB and $n_{iterations}^{(1)}=3$, the mean number of $\bar{n}_{iterations}^{(1)}$ is equal to the maximum value $n_{iterations}^{(1)}$. On the other hand, under the same conditions, with the same signal to noise ratio and $n_{iterations}^{(10)}=3$, it can be seen in FIG. 4a that the mean number of iterations $\bar{n}_{iterations}^{(10)}$ has departed from its maximum value. $n_{iterations}^{(10)}$ can be increased as long as $\bar{n}_{iterations}^{(10)}$ remains below 3, which is the case up to $n_{iterations}^{(10)}=8$. It can be seen in FIG. 7, for the range $C/N \geq -0.75$ dB, that both in terms of BET and PET the division of the block size by a factor 10 affords a substantial improvement in the performance because of the increase in the maximum number of iterations for constant latency.

In general terms, the division of a block by a factor k makes it possible to change, for constant latency, from a turbocode of length N associated with a maximum number of iterations $n_{iterations}^{(1)}$ to a turbocode (N/k, $n_{iterations}^{(k)}$) of length N/k associated with a maximum number of iterations $n_{iterations}^{(k)}$. If, in order to comply with the latency constraint: $\bar{n}_{iterations}^{(k)}=n_{iterations}^{(1)}$, then $n_{iterations}^{(k)}>n_{iterations}^{(1)}$, which allows a concentration of the iterations on the deficient blocks. The choice of the factor k is made according to the performance of the turbocodes (N/k, $n_{iterations}^{(k)}$) satisfying $T_{latency}^{(k)} \leq T$. The choice of k is in fact a compromise between the interleaving gain, which is all the lower, the smaller N/k, and the gain due to the iterative decoding ($n_{iterations}^{(k)}>n_{iterations}^{(1)}$), which is all the higher, the greater k is.

Figure 8:
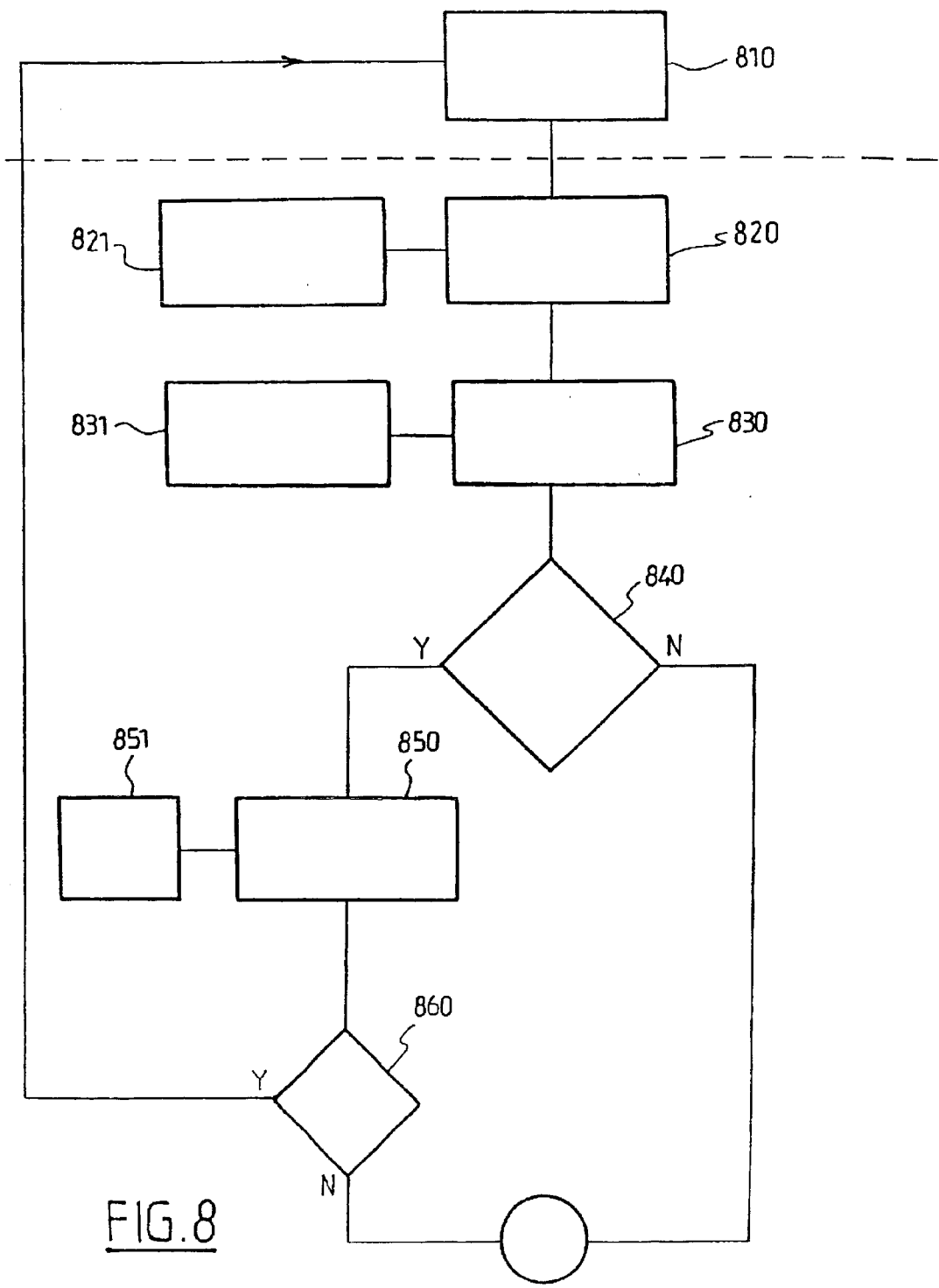
FIG. 8 shows a flow diagram of the method of determining the optimum block size according to a first embodiment of the invention.

FIG. 8 gives schematically a flow diagram for the method of optimising the block size according to a first embodiment of the invention. The transmission depicted at 810 uses an interleaving length N. On reception, there is determined at 820, from N and from an estimation at 821 of the calculation resources and/or the maximum latency time T, the set number of iterations $n_{iterations}^{(1)}$ by means of equation (1). Likewise there is determined at 830, from N and the signal to noise ratio C/N, by means of a table 831, the number of iterations $n_{req}$ required to reach a required level of BET or PET. Next, at 840, $n_{iterations}^{(1)}$ and $n_{req}$ are compared. If $n_{iterations}^{(1)} \geq n_{req}$, the size of the block cannot be divided (since this would, for equal performances, result in an increase in the number of iterations) and the optimisation process is terminated. On the other hand, if $n_{iterations}^{(1)} < n_{req}$, there are sought at 850, in a table 851, having regard to the signal to noise ratio, all the pairs (N/k, $n_{iterations}^{(k)}$), where $k \geq 1$ and divisor of N, such that $T_{latency}^{(k)} \leq T$. The value of k giving the best performance (BET, PET) is then selected, as well as the (largest) associated maximum number of iterations $n_{iterations}^{(k)}$ making it possible to satisfy $T_{latency}^{(k)} \leq T$. At 860 it is tested whether the value of k selected is greater than a threshold value $k_{min}$ guaranteeing the averaging of the actual numbers of iterations. In the negative, the division of the size of the block (k=1) is not carried out. On the other hand, in the affirmative, the factor k is transmitted to the turbocoder on a return channel. The turbocoder adapts the size of the blocks to the value N/k and the size of its internal interleaver or interleavers accordingly.

According to a variant of the invention, the test 840 is not carried out and there are sought directly at 850 the value of k and the associated number $n_{iterations}^{(k)}$ giving the best performance under the latency constraint. It is thus ensured that the best possible performance will be obtained subject to compliance with the said constraint.

The resources can be estimated at 821 by means of a dedicated resource management algorithm, or, a posteriori, by examining the maximum number of iterations effected for a block size N/k.

The tables 831 and 851 can be produced in advance or subsequently from the performance obtained and the actual numbers of iterations. They can also be produced in advance or completed as use of the system continues. The values unavailable in the tables can be calculated by interpolation from the existing values.

Naturally, after division of the size of the block, the system can subsequently return to the largest size block or even to the initial block size if the resource constraint (for example the latency constraint) is relaxed or if the quality of service (QoS) no longer requires optimum performance.

According to a second embodiment of the invention, the process of optimising the size of the block is effected on transmission and the system does not have any return channel between the receiver and the transmitter. The algorithm does not include the estimation of the resources of the receiver but decides, for a given type of application, to improve the error rate (BET, PET) without increasing the latency time of the receiver.

When the size N of the block has been divided by a factor k, the iterative process can be effected in two possible ways.

According to a first variant, the $1^{st}$ decoding iteration is effected for each of the k blocks, and then the $2^{nd}$ decoding iteration is effected for the blocks with residual errors after the $1^{st}$ iteration and so on until the maximum number of iterations is reached or better still until the said available resource or the time allotted for the decoding of the k blocks is exhausted. At each pass the blocks having residual errors are identified by means of the stoppage criterion. In this way, it is certain that the available resource or the allotted latency will be used in an optimum fashion and "lingering" too long on the decoding of a block, which could be prejudicial to the following blocks if k is not sufficiently large to ensure sufficient averaging of the number of iterations, is avoided.

In the case of the example in FIG. 6, the implementation of this variant would be as follows:

| | | |
|---|---|---|
| 1 | Iteration #1 for blocks 1 to 10 | |
| 2 | Iteration #2 for blocks 1 to 10 | -> blocks 1, 2, 5, 6, 10 correct |
| 3 | Iteration #3 for blocks 3, 4, 7, 8, 9 | -> blocks 3, 4, 7, 9 correct |
| 4 | Iteration #4 for block 8 | |
| 5 | Iteration #5 for block 8 | |
| 6 | Iteration #6 for block 8 | |
| 7 | Iteration #7 for block 8 | |
| 8 | Iteration #8 for block 8 | |

This first decoding variant is advantageous when the channel interleaving time $T_{ilc}$ is fixed or when k is small. This is because, in the first case, it is necessary to wait for the length of time $T_{ilc}$ before being able to decode a block and, in the second case, it makes it possible to remedy any averaging defect.

According to a second variant, each of the k=10 blocks is successively decoded. At a maximum $n_{iterations}^{(10)} = 8$ decoding iterations are effected successively on each block using the stop criterion for ideally reaching $\bar{n}_{iterations}^{(10)} = 3$ iterations per block on average over all the k blocks.

In the case of the example in FIG. 6, the implementation of this variant would be as follows:

| | |
|---|---|
| 1. | iterations 1 to 2 for block 1 |
| 2. | iterations 1 to 2 for block 2 |
| 3. | iterations 1 to 3 for block 3 |
| 4. | iterations 1 to 3 for block 4 |
| 5. | iterations 1 to 2 for block 5 |
| 6. | iterations 1 to 2 for block 6 |
| 7. | iterations 1 to 3 for block 7 |
| 8. | iterations 1 to $n^{(10)}_{iterations} = 4$ for block 8 |
| 9. | iterations 1 to 3 for block 9 |
| 10. | iterations 1 to 2 for block 10 |

This second variant is advantageous when the channel interleaving time $T_{ilc}$ is not fixed or when k is large. This is because, if the time $T_{ilc}$ is not fixed, it can be reduced, possibly at the cost of a loss of performance, to a value corresponding to an interleaving on k'<k consecutive blocks of size k/N. As a result the latency time $T_{latency}^{(k)}$ given by (2) can also be reduced. This gain in latency time can be converted into a performance gain by increasing the maximum number of iterations $n_{iterations}^{(k)}$ for each of the k blocks.

It is essential to note that the latency constraint which has essentially been dealt with up to now is only one example of a resource constraint to be complied with for effecting the iterative decoding. Resource can also mean the energy expended by a processor. This will notably be the case if the iterative decoding is dealt with by a fast processor: the constraint relates in this case more to the number of operations to be performed and therefore to the energy expended than to the calculation time itself. In more general terms, resource will mean an additive physical quantity, or a combination of such physical quantities, liable to be expended by the calculation means for effecting the iterative decoding.

In addition, although the description of the invention has essentially been illustrated as a process of the optimisation of the size of turbocoded blocks and resource constraint, it also applies, in a similar manner, to a process of optimising the size of turboequalised blocks under resource constraint, whether this optimisation is carried out at the turboequaliser (the first embodiment) or at the transmitter (the second embodiment).

What is claimed is:

1. A method of optimizing a size of blocks of coded data, comprising:

evaluating a resource (T) available for decoding a block of normal size (N); and identifying, amongst a plurality of block sizes (N/k) which are submultiples of the normal size by an integer factor (k) greater than or equal to 1 and requiring on average a number of iterations ($\bar{n}_{iterations}^{(k)}$) compatible with the said available resource, a block size corresponding to the lowest error rate at the output of iterative decoding.

2. The optimization method according to claim 1, wherein the said available resource is a time or an energy available for receiving all the data of a block and for effecting the iterative decoding on the said block.

3. The optimization method according to claim 1, wherein, the data having been interleaved by a channel interleaver, the said available resource is a time or an energy available for obtaining the data of a block in deinterleaved form and for effecting the iterative decoding on a block of deinterleaved data.

4. The optimization method according to claim 1 wherein said step of evaluating comprises:

determining, for the current block size, a maximum number of iterations ($n_{iterations}^{(1)}$) compatible with the said available resource.

5. The optimization method according to claim 4, further comprising:

estimating as a function of a required maximum error rate, a minimum number of iterations ($n_{req}$) to be effected by the iterative decoding, for the normal block size and the signal to noise ratio.

6. The optimization method according to claim 5, wherein the step of identifying is effected only if the said maximum number of iterations exceeds the said minimum number of iterations.

7. The optimization method according to claim 1, wherein the step of identifying comprises:

selecting, amongst the block sizes (N/k) which are submultiples of the normal size and amongst different maximum numbers of iterations, the block size and a largest maximum number of iterations ($n_{iterations}^{(k)}$) associated with the selected block size, said selected block size and said selected largest maximum number corresponding to the said average number of iterations ($\bar{n}_{iterations}^{(k)}$) compatible with the said available resource.

8. The optimization method according to claim 7, wherein the optimum size which makes it possible to obtain the lowest error rate at the output of the iterative decoding is sought amongst the submultiple sizes selected and for the associated maximum numbers of iterations.

9. The optimization method according to claim 7, wherein, for a given size which is a submultiple by a factor k and a given maximum number of iterations, the mean number of iterations is determined according to the signal to noise ratio as the mean value of the number of iterations which would be effected by the iterative decoding for each block of a succession of blocks of submultiple size, the iterations being stopped on a block of the said submultiple size if a predetermined reliability criterion is satisfied or if the number of iterations for this block reaches the said given maximum number of iterations.

10. The optimization method according to claim 9, further comprising:

storing mean numbers of iterations for different submultiple sizes, different maximum number of iterations and different signal to noise ratios.

11. The optimization method according to claim 10, wherein said step of storing comprises:

updating as the iterative decoding continues.

12. The optimization method according to claim 9, wherein the mean numbers of iterations are obtained by interpolation from values stored in said storing step.

13. A method for iterative decoding of blocks of coded data, the blocks having an initial size, wherein an optimum block size is determined by the method according to one of claims 7 to 12; and in that, the data in a block of initial size having been coded as a sequence of sub-blocks of optimum size, the sub-blocks are decoded, one by one, by a succession of iterations of the iterative decoding, the iterations being stopped for a sub-block if a predetermined reliability criterion is satisfied or if the number of iterations reaches the maximum number of iterations associated with the said optimum size.

14. A method for iterative decoding of blocks of coded data, the blocks having an initial size, wherein an optimum block size is determined by the method according to one of claims 7 to 12; and in that, the data in a block of initial size having been coded as a sequence of sub-blocks of optimum size, the sub-blocks are decoded by effecting successively, on each sub-block, an iteration of the iterative decoding, an iteration not being effected for a sub-block if a predetermined stop criterion is satisfied or if the number of iterations reaches the maximum number of iterations associated with the said optimum size.

15. A method for the iterative decoding of blocks of coded data, the blocks having an initial size, wherein an optimum block size is determined by the method according to one of claims 7 to 12; and in that, the data in a block of initial size having been coded as a sequence of sub-blocks of optimum size, the sub-blocks are decoded by successively effecting on each sub-block an iteration of the iterative decoding, an iteration not being effected for a sub-block if a predetermined stop criterion is satisfied or if the said available resource is exhausted.

16. A decoder configured to iteratively decode blocks of data coded by a turbocoder, comprising:

means for implementing the optimization method according to one of claims 1 to 12, said means including means for transmitting said optimum block size information to the turbocoder.

17. A coding/decoding system, comprising:

a turbocoder configured to code blocks of data; and an iterative decoding device according to claim 16, said iterative decoding device configured to decode the blocks of data coded by the turbocoder and comprising means for receiving the said optimum block size information, and means for modifying the size of at least one internal interleaver according to the said information received.

18. A coding device configured to code blocks of data, comprising:
   means for implementing the optimization method according to one of claims 1 to 12, said means configured to supply an optimum block size; and
   means for adaptively modifying the size of the blocks of coded data according to the said optimum block size.

19. A turboequalization device configured to turboequalize blocks of data coded by a coder and subsequently modulated, comprising:
   means for implementing the optimization method according to one of claims 1 to 12, said means configured to supply an optimum block size; and
   means for transmitting optimum block size information to the coder.

* * * * *